United States Patent [19]
Lee et al.

[11] Patent Number: 5,359,213
[45] Date of Patent: Oct. 25, 1994

[54] CHARGE TRANSFER DEVICE AND SOLID STATE IMAGE SENSOR USING THE SAME

[75] Inventors: Seo K. Lee, Sungnam; Uya Shinji, Kwancheon, both of Rep. of Korea

[73] Assignee: Goldstar Electron Co., Ltd., Rep. of Korea

[21] Appl. No.: 40,072

[22] Filed: Mar. 30, 1993

[30] Foreign Application Priority Data

Apr. 3, 1992 [KR] Rep. of Korea ............... 5608/1992

[51] Int. Cl.$^5$ ............... H01L 29/796; H01L 27/14; H01L 31/00
[52] U.S. Cl. ............... 257/223; 257/218; 257/224; 257/233; 257/239; 257/241; 257/250; 257/455
[58] Field of Search ............... 257/215–224, 257/231–233, 239, 241, 453–456, 449

[56] References Cited

U.S. PATENT DOCUMENTS

| | | |
|---|---|---|
| 4,223,329 | 9/1980 | Jambotkar ............... 257/215 |
| 4,229,754 | 10/1980 | French ............... 257/215 |
| 4,468,684 | 8/1984 | Esser et al. ............... 257/215 |
| 4,613,895 | 9/1986 | Burkey et al. ............... 257/241 |

FOREIGN PATENT DOCUMENTS 535604   11/1976   U.S.S.R. ............... 257/216

OTHER PUBLICATIONS

Barsaw "Characteristics of the Overland Charge-Coupled Device" IEEE Trans. Electron Devices vol. ED-26 (Feb. 1979) pp. 123–134.

*Primary Examiner*—Gene M. Munson
*Attorney, Agent, or Firm*—Poms, Smith, Lande & Rose

[57] ABSTRACT

A charge transfer device and a solid state image sensor using the same, capable of transferring signal charge at a high signal to noise ratio (S/N ratio) and preventing an occurrence of dark current. They include a double-layered charge transfer path structure provided by forming a surface channel region on a buried channel region formed in a semiconductor substrate, the surface channel region having a conductivity opposite to that of the buried channel region. The surface channel region of the doubled-layered structure is used for accumulating dark current generated from boundary surfaces between the substrate and a gate insulating film, whereas the buried channel region is used for transferring optical signal charge. Where minus and/or plus drive voltages are applied to the transfer electrodes, there is no increase in dark current, in accordance with the present invention. The quantity of transferred signal charge can be greatly increased.

14 Claims, 6 Drawing Sheets

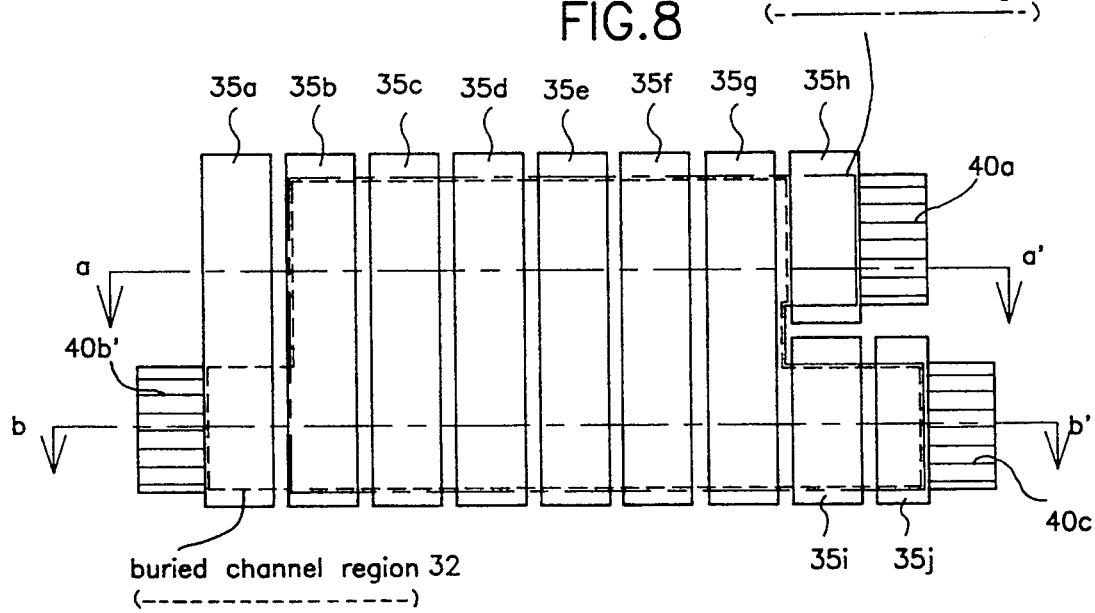
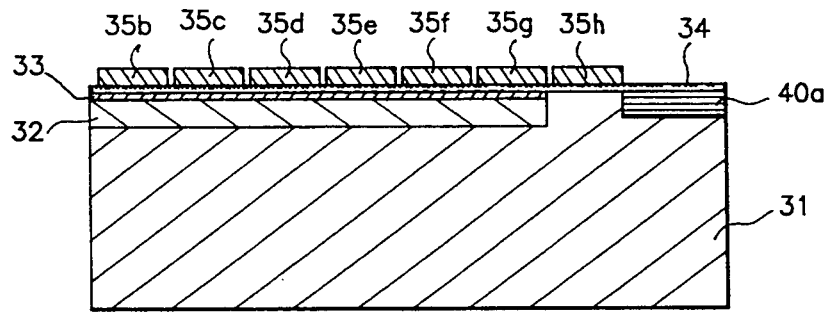
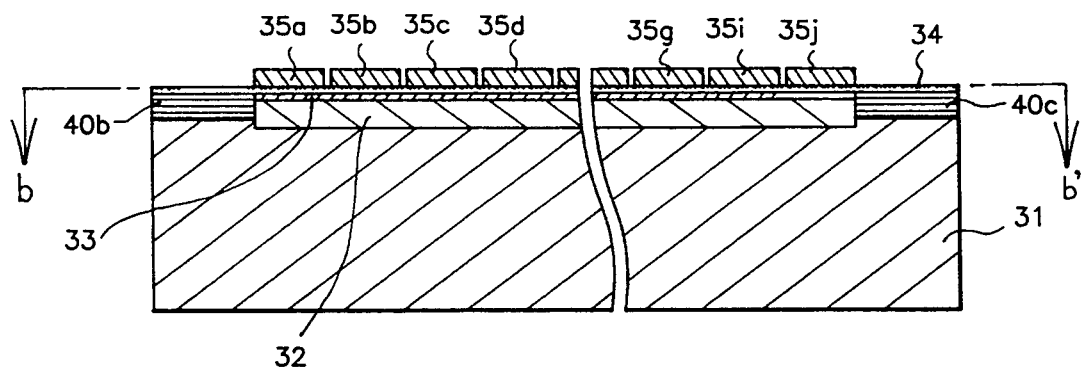

CHARGE TRANSFER DEVICE AND SOLID STATE IMAGE SENSOR USING THE SAME

BACKGROUND OF THE INVENTION

1. Field of the Invention

The present invention relates to a charge transfer device and a solid state image sensor using the same, and more particularly to a charge transfer device and a solid state image sensor using the same, capable of transferring signal charge at a high signal to noise ratio (S/N ratio) and preventing an occurrence of dark current.

2. Description of the Prior Art

Recently, charge coupled devices (CCDs) have been used as charge transfer devices having a high S/N ratio. In particular, such CCDs have been applied to solid state image sensors. Such CCDs are classified into surface channel CCDs and buried channel CCDs, in terms of the channel region structure.

Referring to FIGS. 1 and 2, there are illustrated respective sections of a surface channel CCD and a buried channel CCD, and potential profiles according to the sections.

In the drawings, the reference numeral 6 designates a potential profile of each conduction band and the reference numeral 7 designates a potential profile of each valence band. Also, the reference numeral 8 designates a voltage applied to each transfer electrode 5.

In the surface channel CCD shown in FIG. 1, a channel region is formed by inverting the conductivity of the surface of a p type silicon substrate 2a using a voltage 8 applied to the transfer electrode 5 made of polysilicon. In this case, a peak potential is present at a boundary surface between the p type silicon substrate 2a and a first electrode insulating film 4 in the channel region. As a result, an interaction between the potential and the transferred signal charge is actively carried out at the boundary surface, thereby causing the charge transfer efficiency and the S/N ratio to decrease.

On the other hand, in the buried channel CCD shown in FIG. 2, such an interaction between the potential and the transferred signal charge occurs infrequently, since a peak potential is present in the p type silicon substrate 2a.

Accordingly, the buried channel CCD has a lower charge transfer capacity than the surface channel CCD, even though it has a higher S/N ratio than the surface channel CCD.

The primary cause of a dark current generated in the surface channel CCD or the buried channel CCD is the charge generated due to the potential present at the boundary between the p type silicon substrate 2a and the first electrode insulating film As a result of an improvement in semiconductor material and a cleanliness of fabricating processes and an improvement in photo sensing structure, it has been possible to reduce the dark current to 1 nA/cm$^2$ even under a condition of a high temperature of 60° C.

However, this value of dark current has been satisfied no longer, since standard signal charge has been recently on decreasing trend, due to increased demands on compactness and high sensitivity of solid state image sensors.

Also, an increase in integration degree results in a decrease in channel region width, so that a high narrow channel effect occurs. Due to such a high narrow channel effect, the quantity of signal charge handled in CCDs is undesirably reduced.

As an effective method for increasing the quantity of handled signal charge, there has been known a method in which a plus voltage and a minus voltage are used as CCD drive voltages. However, this method encounters a problem of an increase in dark current.

In cases of low speed CCDs involving such a problem relating to the dark current, accordingly, only the minus voltage (that is, when electrons are the signal charge) causing no occurrence of dark current has been used.

FIG. 3 illustrates a section, corresponding to one pixel, of a color solid state image sensor using an interline transfer type CCD as its charge transfer device.

In the structure shown in FIG. 3, filter layers 22a to 22c of three colors, namely, red, green and blue are formed above a photodiode 13. The filter layers 22a to 22c serve to output color signals. Also, a photodetector 13 of a certain kind is provided in the structure of FIG. 3. The photodetector 13 may be a pn-junction photodiode.

However, color filters such as red color filter, green color filter and blue color filter are bad in terms of a light utilizing efficiency, since they serve to absorb colors other than desired particular wavelengths which transmitted therethrough.

For realizing a color solid state image sensor with a higher efficiency, accordingly, it is required to provide a technique capable of simultaneously obtaining three color signals with different wavelength bands, namely, a red color signal, a green color signal and a blue color signal. However, it was conventionally impossible to realize a single solid state image sensor capable of simultaneously obtaining color signals with different wavelengths from a received light.

In FIG. 3, the reference numeral 1 designates a n type silicon substrate, 2b a p type well layer substrate, 4 a first electrode insulating film, 10 a channel stop region, 21 and 23 smoothing layers, 25 a p type hole accumulating layer, 26 a photo shield layer, 27 a first polysilicon transfer electrode, 28 a second polysilicon transfer electrode, and 29 a second electrode insulating film.

FIG. 4 is a block diagram of a solid state image sensor including two kinds of photodetectors with different spectral sensitivity formed on a semiconductor substrate. FIG. 5 illustrates a section, corresponding to one pixel, of the solid state image sensor shown in FIG. 4.

In FIG. 5, a first one of the photodetectors is a pn-junction photodiode 13 for a visible range, whereas a second one of the photodetectors is a Schottky barrier diode 12 for an infrared ray range. The Schottky barrier diode 12 is made of PtSi.

In FIG. 5, the reference numeral 2b, 4, 10 and 29 are the same as those of FIG. 3.

The structure shown in FIG. 4 also comprises a plurality of first vertical CCDs 14a for transferring optical signal charge of the visible range and a plurality of second vertical CCDs 14b for transferring optical signal charge of the infrared ray range, so as to read individually signal charge from the photodetectors 13 for the visible range and the photodetectors 12 for the infrared ray range.

Also, the structure comprises a first horizontal CCD 17a for transferring optical signal charge of the visible range from the first vertical CCDs 14a and a second horizontal CCD 17b for transferring optical signal charge of the infrared ray charge from the second vertical CCDs 14b.

In FIG. 4, the reference numeral 29a designates an insulating film for providing an electrical isolation between the first horizontal CCD 17a and the second horizontal CCD 17b.

In such a conventional technique, it is required to provide individual charge transfer paths for the two kinds of photodetectors, that is, the first vertical CCDs, the second vertical CCDs, the first horizontal CCD and the second horizontal CCD. As a result, the conventional structure involves a problem that all signal charge transfer paths should be integrated together in one device.

SUMMARY OF THE INVENTION

Therefore, an object of the invention is to solve the above-mentioned problems encountered in the prior arts and to provide a charge transfer device and a solid state image sensor capable of reducing an occurrence of dark current.

Another object of the invention is to provide a charge transfer device and a solid state image sensor capable of having a spectroscopic function obtained without using no color filter.

Still another object of the invention is to provide a charge transfer device and a solid state image sensor capable of detecting various kinds of light beams.

For accomplishing these object, the present invention provides a charge transfer device and a solid state image sensor using the same, including a double-layered charge transfer path structure provided by forming a surface channel region on a buried channel region formed in a semiconductor substrate, the surface channel region having a conductivity opposite to that of the buried channel region.

That is, the surface channel region of the doubled-layered structure is used for accumulating dark current generated from boundary surfaces between the substrate and a gate insulating film, whereas the buried channel region is used for transferring optical signal charge. As a result, it is possible to realize a solid state image sensor with low dark current and high signal to noise ratio. Where minus and/or plus drive voltages are applied to the transfer electrodes (or gate electrodes), there is no increase in dark current, in accordance with the present invention. The quantity of transferred signal charge can be greatly increased.

BRIEF DESCRIPTION OF THE DRAWINGS

Other objects and aspects of the invention will become apparent from the following description of embodiments with reference to the accompanying drawings in which:

FIG. 8 is a schematic plan view of a charge transfer device according to a first embodiment of the present invention;

FIG. 9 is a cross-sectional view taken along the line a—a of FIG. 8;

FIG. 10 is a cross-sectional view taken along the line b—b of FIG. 8;

DETAILED DESCRIPTION OF THE PREFERRED EMBODIMENTS

Figure 1:
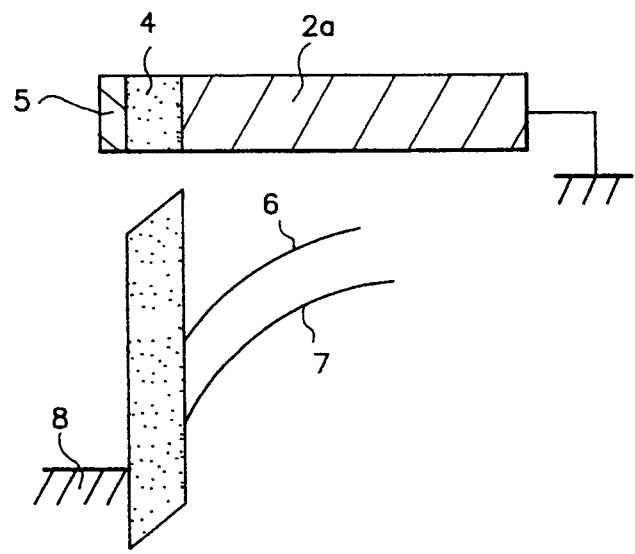
FIG. 1 is a schematic view illustrating a section of a conventional surface channel CCD and a potential profile according to the section.
Figure 2:
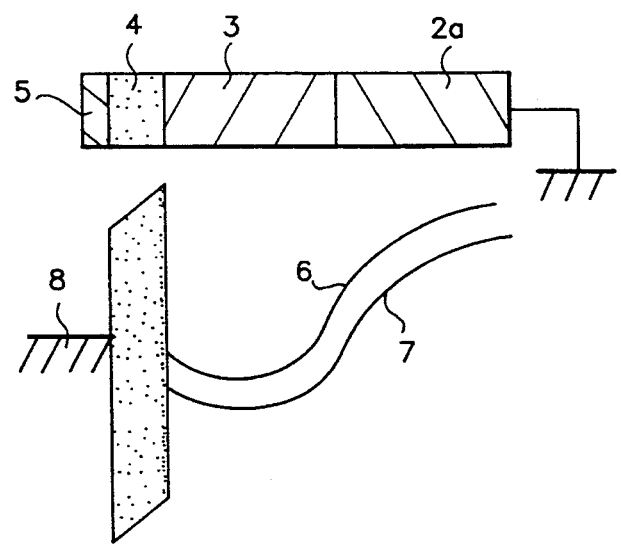
FIG. 2 is a schematic view illustrating a section of a conventional buried channel CCD and a potential profile according to the section.
Figure 3:
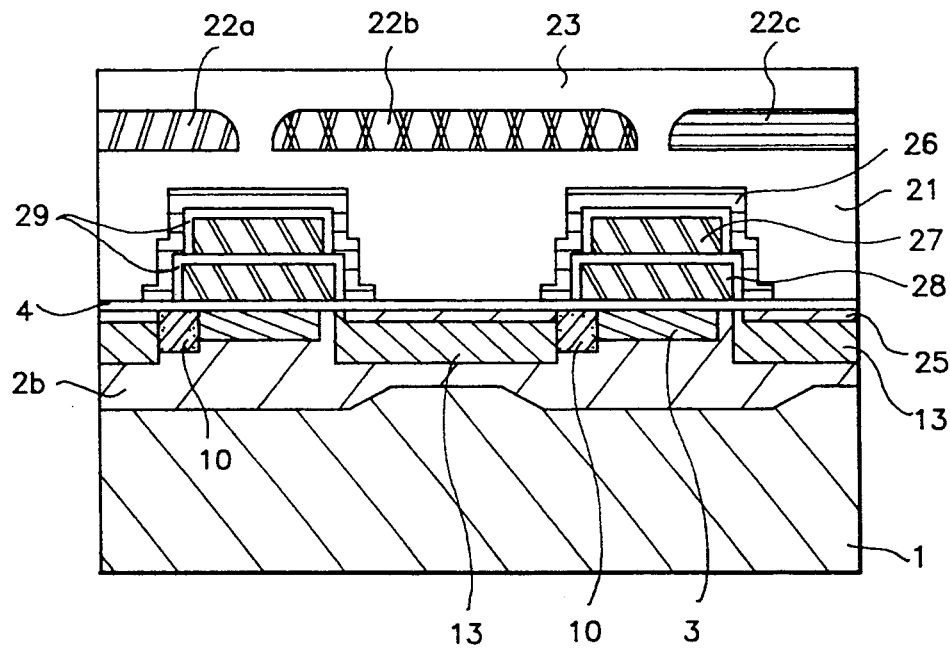
FIG. 3 is a schematic sectional view illustrating a section, corresponding to one pixel, of a conventional solid state image sensor using an interline transfer type CCD as its charge transfer device.
Figure 4:
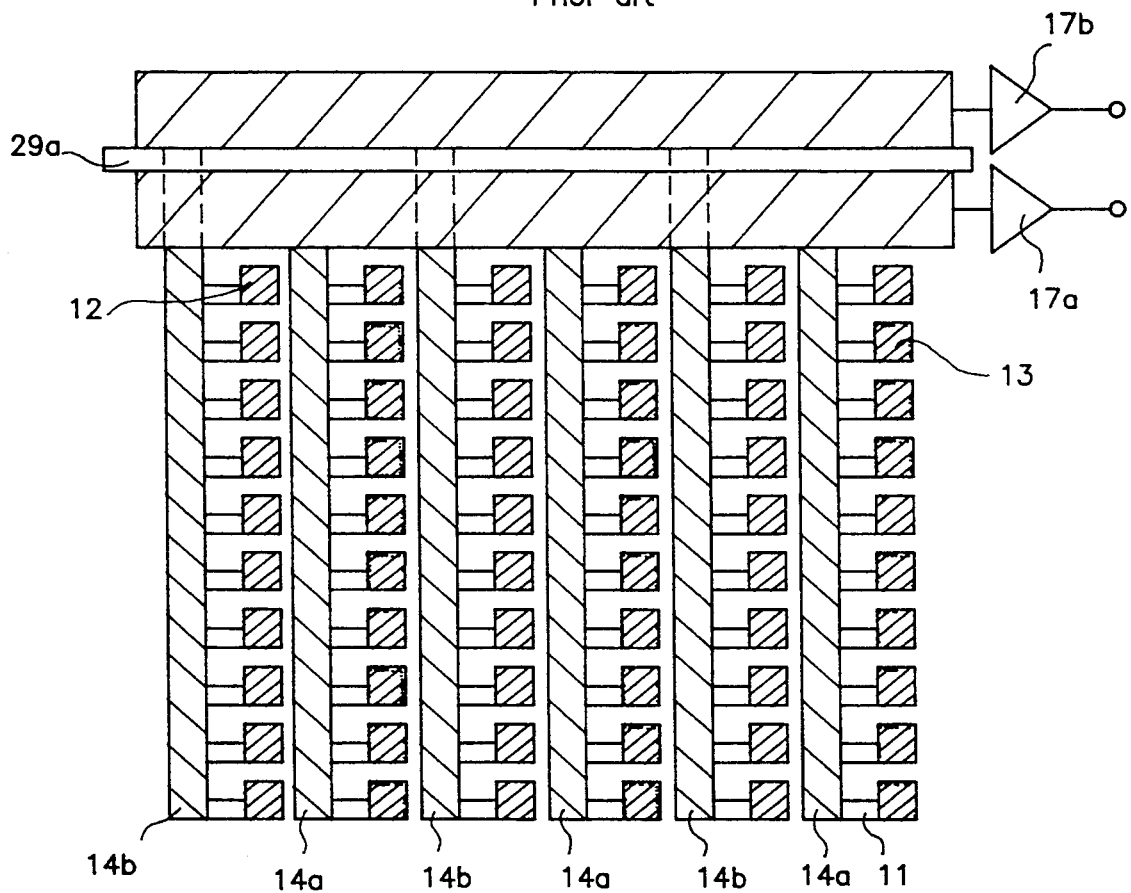
FIG. 4 is a block diagram of a solid state image sensor including two kinds of photodetectors with different spectral sensitivity, formed on a semiconductor substrate.
Figure 5:
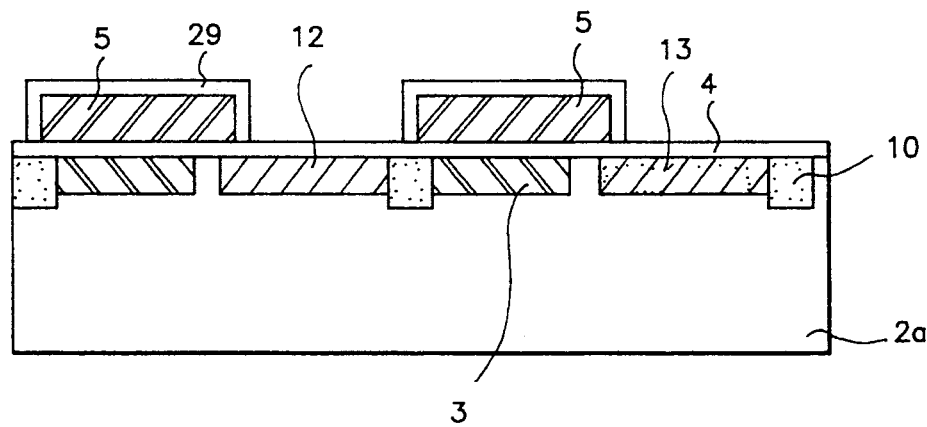
FIG. 5 illustrates a section, corresponding to one pixel, of the solid state image sensor shown in FIG. 4.
Figure 6:
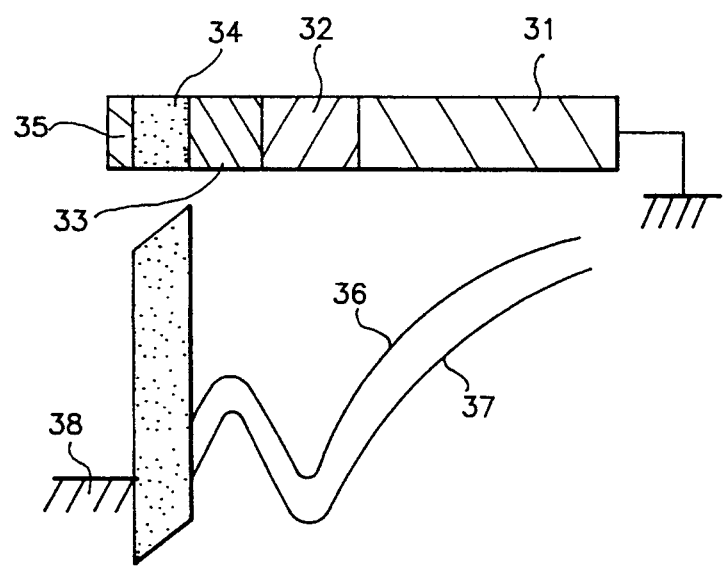
FIG. 6 is a schematic view illustrating a section of a CCD according to the present invention and a potential profile according to the section.

FIG. 6 is a schematic view for explaining a charge transfer device, namely a CCD, according to the present invention. FIG. 6 shows a section of a channel region for transferring signal charge and a potential profile according to the section. On the other hand, FIG. 7 is a sectional view of the CCD according to the present invention.

Figure 7:
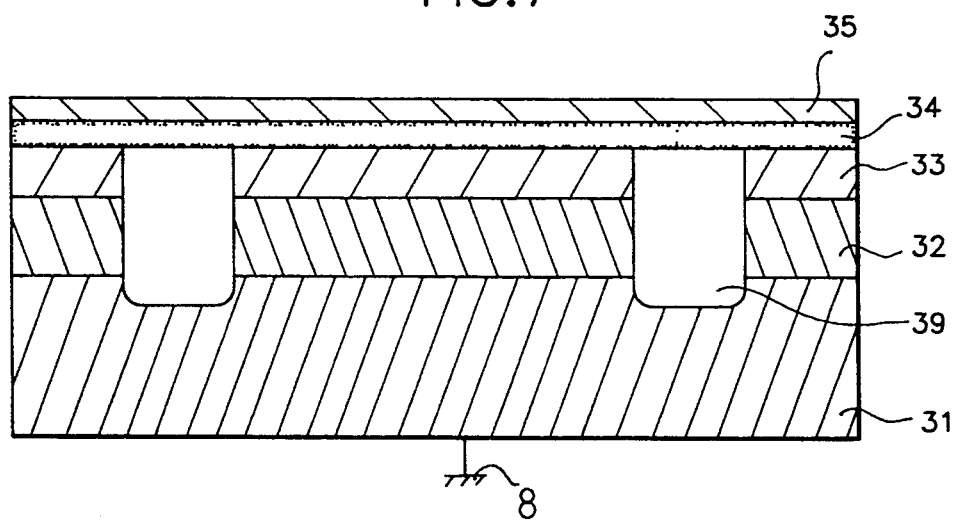
FIG. 7 is a schematic sectional view of a CCD according to the present invention.

As shown in FIG. 7, the CCD comprises a p type silicon substrate for providing a first conductivity type semiconductor substrate 31, a n type silicon layer for providing a second conductivity type buried channel region 32, and a p type silicon layer for providing a surface channel region 33.

Over the p type silicon layer as the surface channel region 33, an oxide film is formed, so as to provide an electrode insulating film 34. Over the oxide film is formed a polysilicon layer for providing a plurality of transfer electrodes 35.

In FIG. 6, the reference numeral 36 designates a potential profile of a conduction band and the reference numeral 37 designates a potential profile of a valence band. Also, the reference numeral 38 designates a voltage applied to the polysilicon layer as the transfer electrodes 35.

As shown in FIG. 7, each channel region including one buried channel region 32 and one surface channel region 33 is electrically isolated from neighboring channel region, by a p+ type silicon region which is a channel stop region 39. Here, the reference character "+" represents a high impurity concentration.

For discharging signal charge from each surface channel region 33 and reading signal charge, free of noise and dark current, from each buried channel region 32, it is required to output individually signal charge from the surface channel region 33 and the buried channel region 32.

Referring to FIG. 8, there is illustrated a structure capable of satisfying the above-mentioned requirement. That is, a charge transfer device according to the present invention is shown in FIGS. 8 to 10.

As shown in FIGS. 8 to 10, the charge transfer device (namely, CCD) comprises a semiconductor substrate 31 of a first conductivity type, a surface channel region 33 of the first conductivity type formed over the first conductivity type semiconductor substrate 31, and a buried channel region 32 of a second conductivity type formed beneath the surface channel region 33 and extending beyond one side portion of the surface channel region 33 at its one side portion (FIG. 10). Over the resulting exposed surface, an electrode insulating film 34 is formed. The CCD also comprises a charge injection source 40b formed in the surface of the semi conductor substrate 31 such that it is in contact with the side portion of the buried channel region 32 extending beyond the surface channel region 33, a floating diffusion region 40c formed in the surface of the semiconductor substrate 31 such that it is in contact with the other side portion of the buried channel region 32 and adapted to detect signal charge, and a sweep-out drain 40a formed in the surface of the semiconductor substrate 31 such that it is spaced apart a predetermined distance from the other side portion of the surface channel region 33 and adapted to discharge dark current accumulated in the surface channel region 33. A charge injection electrode 35a for injecting signal charge into the buried channel region 32 is formed on the surface portion of the electrode insulating film 34 disposed over the one side portion of the buried channel region 32 extending beyond the surface channel region 33. Also, a sweep-out electrode 35h for transferring dark current to the sweep-out drain 40a is formed on a surface portion of the electrode insulating film 34 disposed between the surface channel region 33 and the sweep-out drain 40a. The CCD also comprises a plurality of uniformly spaced transfer electrodes 35b to 35j formed on a surface portion of the electrode insulating film 34 disposed over the surface channel region 33 between the charge injection electrode 35a and the sweep-out drain 40a.

As shown in FIGS. 8 and 9, the sweep-out drain 40a is disposed at the middle of the charge transfer path, so as to discharge dark current from the surface channel region 33, via the sweep-out electrode (gate electrode) 35h.

The charge injection electrode 35a and the charge injection source 40b serve to achieve the signal charge injection. The floating diffusion region 40c serves to detect signal charge from the buried channel region 32, via the transfer electrode 35j. The charge injection electrode 35a is disposed only over the buried channel region 32, since no signal charge is injected into the surface channel region.

Figure 11:
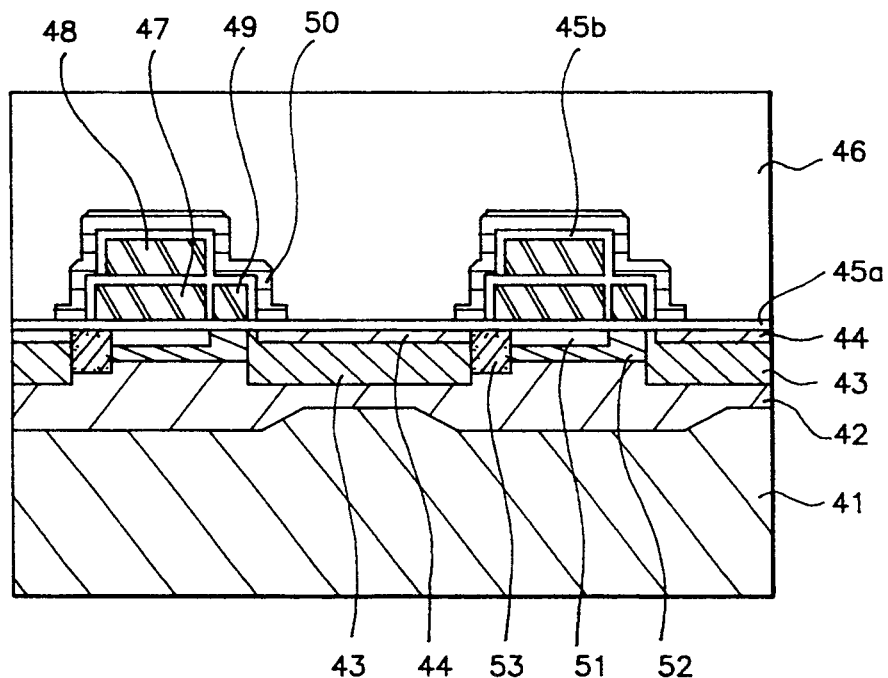
FIG. 11 is a schematic sectional view illustrating a second embodiment of the present invention wherein the charge transfer device according to the present invention is applied to a solid state image sensor of the interline transfer type using a single kind, namely, the same kind of photodetectors.

Referring to FIG. 11, there is illustrated a second embodiment of the present invention wherein the charge transfer device (namely, CCD) according to the present invention is applied to a solid state image sensor of the interline transfer type using a single kind, namely, the same kind of photodetectors.

As shown in FIG. 11, the solid state image sensor comprises a p type silicon substrate 41, a p type well 42 formed over the p type silicon substrate 41, and a plurality of uniformly spaced p+ hole accumulating layers 44 formed on the p type well 42 and adapted to accumulate holes, so as to reduce dark current. Beneath each hole accumulating layer 44, a n type photodetector 43 is formed such that it extends beyond one side portion of the hole accumulating layer 44 at its one side portion. Over the well 42 are also formed a plurality of n type buried channel regions 52 each being in contact with each photodetector 43. Over each buried channel region 52, a p type surface channel region 51 is formed such that it does not extend up to the one side portion of the buried channel region 52 at its one side portion. The solid state image sensor also comprises a plurality of p+ type channel stop regions 53 each formed between the other side portions of each surface channel region 51 and each buried channel region 52 and the other side portions of each hole accumulating layer 44 and each photodetector 43. A first electrode insulating film 45a is also formed over the resulting entire exposed surfaces of the buried channel regions 52, the surface channel regions 51, the channel stop regions 53, the photodetectors 43 and the hole accumulating layers 44. The solid state image sensor also comprises a plurality of charge injection electrodes 49 each formed on the first electrode insulating film 45a at one side portion of each buried channel region 52 extending beyond one side portion of each corresponding surface channel region 51, a plurality of first polysilicon transfer electrodes 47 each formed on the first electrode insulating film 45a above each surface channel region 51, a plurality of second polysilicon transfer electrodes 48 each formed on each first polysilicon transfer electrode 47, a plurality of second electrode insulating films 45b formed around the first and second polysilicon transfer electrodes 47 and 48 and adapted to isolate the electrodes from one another and from external, a plurality of photo shield layers 50 each formed over each second electrode insulating film 45b, and a smoothing layer formed over the resulting entire exposed surfaces of the first electrode insulating film 45a and the photo shield layers 50.

In accordance with the embodiment shown in FIG. 11, the charge injection source 40b and the charge injection electrode 35a of the embodiment shown in FIGS. 8 to 10 are used as each n type photodetector 43 and each transfer electrode 49.

The n type photodetector 43 are also called buried photodiodes. For reducing dark current, each p+ type hole accumulating layer 44 is formed over each n type photodetector 43. Accordingly, it is possible to restrain a generation of electron beam from a boundary surface between the p type well 42 and the first electrode insulating film 45a.

For controlling the charge transfer from the n type photodetectors 43 to the charge transfer regions, namely, CCDs, the signal charge generated from the n type buried photodetectors 43 is transferred to the n type buried channel regions 52, by the charge injection transfer electrodes 49.

In accordance with the embodiment of FIG. 11, the p type well 42 has shallow portions disposed beneath the n type photodetectors 43. At other portions, the p type well 42 has a larger depth. With such a structure, it is possible to restrain an over flow drain.

Where the p type surface channel regions 51 are to be utilized for the signal charge transfer, the sweep-out drain 40a of FIG. 8 for sweeping out signal charge transferred from each surface channel region 51 is altered into the flouting diffusion region 40c for detecting signal charge. Also, the charge injection electrode 35a and the charge injection source 40b of FIG. 8 are added to each p type surface channel region 51.

Figure 12:
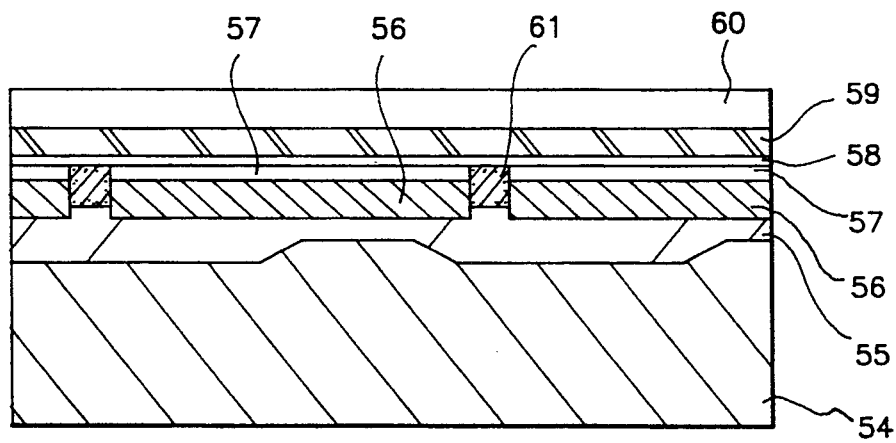
FIG. 12 is a schematic sectional view illustrating a third embodiment of the present invention wherein the charge transfer device according to the present invention is applied to a frame transfer type solid state image sensor using a single kind of photodetectors.

Referring to FIG. 12, there is illustrated a third embodiment of the present invention wherein the charge transfer device (namely, CCD) according to the present invention is applied to a frame transfer type solid state image sensor using a single kind of photodetectors.

As shown in FIG, 12, the solid state image sensor comprises a n type silicon substrate 54, a p type well 55 formed over the n type silicon substrate 54, and a plurality of uniformly spaced p type surface channel regions 57 formed in the surface of the p type well 55, a plurality of n type buried channel regions 56 each formed beneath each surface channel region 57 such that it is in contact with the surface channel region 57. The solid state image sensor also comprises a plurality of p type channel stop regions 61 formed between neighboring channel regions each including each surface channel region 57 and each buried channel region 56. An electrode insulating film 58 is formed over the resulting entire exposed surfaces of the channel stop regions 61, the buried channel regions 56 and the surface channel regions 57. Also, the solid state image sensor comprises a transfer electrode 59 formed over the electrode insulating film 58 and a smoothing layer 60 formed over the transfer electrode 59.

In accordance with the embodiment of FIG. 12, the p type surface channel regions 57 and the n type buried channel regions 56 are used as photodetectors. This embodiment is characterized by this fact.

Since frame transfer type solid state image sensors have light receiving elements throughout their surfaces, the frame transfer type solid state image sensors shown in FIG. 12 can be also described, in conjunction with its light receiving elements.

In this embodiment, as the depth of each p type surface channel region 57 is properly selected, signal charge mainly generated by incident light with short wavelength can be accumulated in the p type surface channel region 57. Also, signal charge generated by incident light with long wavelength can be accumulated in each n type buried channel region 56. This is because silicon depends considerably upon the wavelength, when it absorbs light of the visible range. As a result, light with short wavelength can be substantially absorbed at a position spaced a short distance apart from the silicon surface, whereas light with long wavelength can be absorbed at a position spaced a long distance apart from the silicon surface.

As signal charge obtained from the surface channel regions 57 and the buried channel regions 56 are individually outputted, information relating to the color of incident light can be obtained.

Although information capable of reproducing original color can be hardly obtained by using only two channel regions, the separation of color signals can be accomplished by adding another means for giving limitation conditions on the color of an object or the wavelength distribution of an illumination source.

Figure 13:
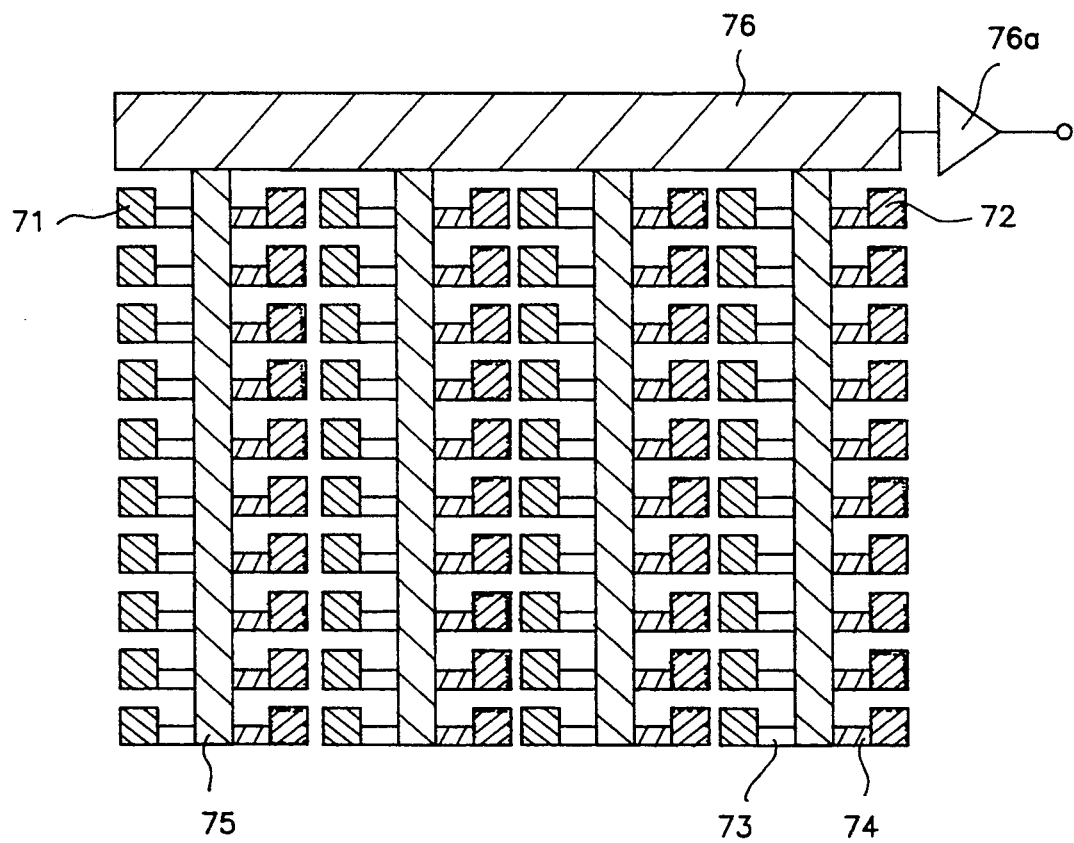
FIGS. 13 and 14 are schematic sectional views illustrating a solid state image sensor according to a fourth embodiment of the present invention.
Figure 14:
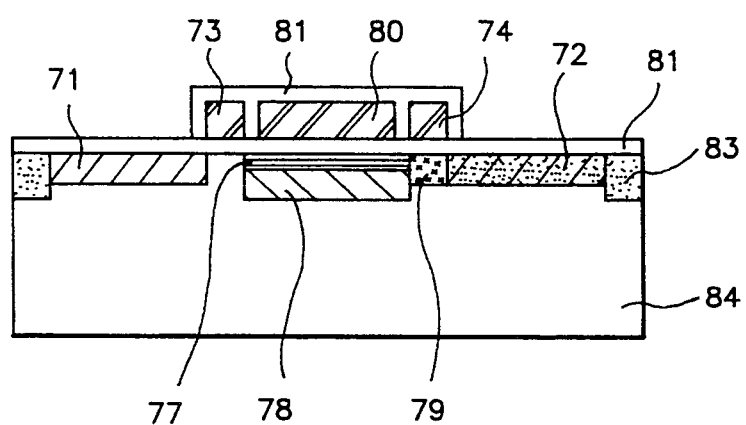

FIGS. 13 and 14 illustrates a fourth embodiment of the present invention wherein the charge transfer device (namely, CCD) is applied to a solid state image sensor using two kinds of photodetectors.

As shown in FIGS. 13 and 14, the solid state image sensor according to this embodiment comprises a p type semiconductor substrate 84, a plurality of uniformly spaced p type channel stop regions 83 formed on the semiconductor substrate 84, a plurality of p type surface channel regions 77 each formed in the central portion of each surface portion of the semiconductor substrate 84 disposed between neighboring channel stop regions 83, and a plurality of n type first buried channel regions 78 each formed beneath each surface channel region 77 such that it is in contact with the surface channel region 77. The solid state image sensor also comprises a plurality of pn-junction photodiodes 72 for the visible range each formed on the semiconductor substrate 84 such that it is spaced a predetermined distance apart from one side portions of each corresponding surface channel region 77 and each corresponding first buried channel region 78 and in contact with each adjacent channel stop region 83, a plurality of Schottky barrier diodes 71 of the infrared ray range made of Ptsi and each formed on the semiconductor substrate 84 such that it is spaced a predetermined distance apart from the other side portions of each corresponding surface channel region 77 and each corresponding first buried channel region 78 and in contact with each adjacent channel stop region 83, and a plurality of second buried channel regions 79 each formed in each surface portion of the semiconductor substrate 84 disposed between each Schottky barrier diode 71 and the other side portions of each surface channel region 77 and each first buried channel region 78. A first electrode insulating film 81 is also formed over the resulting entire exposed surfaces of the channel stop regions 83, the surface channel regions 77, the semiconductor substrate 84, the second buried channel regions 79, the pn-junction photodiodes 72 and the Schottky barrier diodes 71. The solid state image sensor also comprises a plurality of surface channel region electrodes 73 each formed on the first electrode insulating film 81 between each photodiode 72 and each corresponding surface channel region 77 and adapted to transfer signal charge from the photodiode 72 to the surface channel region 77, a plurality of buried channel region electrodes 74 each formed on each surface portion of the first electrode insulating film 81 disposed over each second buried channel region 79 and adapted to transfer signal charge from each corresponding Schottky barrier diode 71 to each corresponding buried channel region 78, via the second buried channel region 79, and a plurality of transfer electrodes 80 each formed on each surface portion of the first electrode insulating film 81 disposed over each surface channel region 77. A plurality of second electrode insulating films 82 are formed around the transfer electrodes, the surface channel region electrodes 73 and the buried channel region electrodes 74, so as to isolate them from external. The solid state image sensor also comprises a horizontal CCD 76 adapted to sequentially output signal charge from the surface channel regions 77 and the first buried channel regions 78, in the charge input order, and a sensing amplifier 76a adapted to sense signal charge from the horizontal CCD 76.

In the solid state image sensor, a plurality of Schottky barrier diodes 71 for the infrared ray range made of PtSi and a plurality of pn-junction photodiodes 72 for the visible range arranged along the opposite side portions of each of vertical CCDs 75, respectively. As shown in FIG. 14, the pn-junction photodiodes 72 serve to transfer signal charge to the n type first buried channel regions 78, via the buried channel region electrodes 74. On the other hand, the Schottky barrier diodes 71 serve to transfer signal charge to the p type surface channel regions 77, via the surface channel region electrodes 73.

That is, the buried channel region electrodes 74 are arranged along each vertical CCD 75 so that they correspond to the pn-junction photodiodes 72 for the visible range arranged along the vertical CCD 75, respectively. The surface channel region electrodes 73 are arranged along each vertical CCD 75 so that they correspond to the Schottky barrier diodes 71 for the infrared ray range arranged along the vertical CCDs 75, respectively, Each Schottky barrier diode 71 for the infrared ray range and each pn-junction photodiode 72 are commonly associated with one vertical CCD 75 and one horizontal CCD 76, as shown in FIG. 14. This is because optical signal charge of the visible range and optical signal charge of the infrared ray range are individually transferred through the surface channel regions 77 and the first buried channel regions 78.

As shown in FIG. 13, the solid state image sensor according to the fourth embodiment uses only one horizontal CCD 76 for multiple vertical CCDs 75.

The signal charge based on light of the infrared ray range is transferred to the surface channel regions 77, whereas the signal charge based on light of the visible range is transferred to the first buried channel regions 78, via the second buried channel regions 79, as shown in FIG. 14.

Also, the optical signal charge of the infrared ray range is independently read by the surface channel region electrodes 73, whereas the optical signal charge of the visible range is independently read by the buried channel region electrodes 74.

In the section, corresponding to one pixel, of the solid state image sensor shown in FIG. 14, the transfer electrode 80 has a reduced lateral length, as compared with the conventional transfer electrode 5.

Although the photodetector arrangement in the fourth embodiment is a two-dimensional arrangement, the present invention may be equivalently applied to other solid state image sensors with one-dimensional photodetector arrangements.

in accordance with the fourth embodiment, the kind of photodetectors is not limited to two kinds. Multiple kinds of photodetectors may be arranged to read signal charge of multiple colors.

As apparent from the above description, the present invention makes it possible to define two independent channels in each charge transfer region, to decrease an occurrence of dark current, improve the signal to noise ratio, obtain various color information from incident light, and achieve a high integration degree of pixels.

What is claimed is:

1. A charge transfer device comprising:
    a semiconductor substrate of a first conductivity type;
    a surface channel region of the first conductivity type formed over the first conductivity type semiconductor substrate;
    a buried channel region of a second conductivity type formed beneath the surface channel region and extending beyond one side portion of the surface channel region at its one side portion;
    an electrode insulating film is formed over the resulting entire exposed surfaces of the semiconductor substrate, the surface channel region and the buried channel region;
    a charge injection source formed in the surface of the semiconductor substrate such that it is in contact with the one side portion of the buried channel region extending beyond the surface channel region;
    a floating diffusion region formed in the surface of the semiconductor substrate such that it is in contact with the other side portion of the buried channel region and adapted to detect signal charge;
    a sweep-out drain formed in the surface of the semiconductor substrate such that it is spaced a predetermined distance apart from the other side portion of the surface channel region and adapted to discharge dark current accumulated in the surface channel region;
    a charge injection electrode formed on a surface portion of the electrode insulating film disposed over the one side portion of the buried channel region extending beyond the surface channel region, the charge injection electrode being adapted to inject signal charge into the buried channel region;
    a sweep-out electrode formed on a surface portion of the electrode insulating film disposed between the surface channel region and the sweep-out drain, the sweep-out electrode being adapted to transfer dark current to the sweep-out drain; and
    a plurality of uniformly spaced transfer electrodes formed on a surface portion of the electrode insulating film disposed over the surface channel region between the charge injection electrode and the sweep-out drain.

2. A charge transfer device in accordance with claim 1, wherein the first conductivity type semiconductor substrate is a p type silicon substrate.

3. A solid state image sensor comprising:
    a semiconductor substrate of a first conductivity type;
    a well of a second conductivity type formed over the semiconductor substrate;
    a plurality of uniformly spaced hole accumulating layers of the second conductivity type formed on the surface of the well and adapted to accumulate holes and thus reduce dark current;
    a plurality of photodetectors of the first conductivity type each formed beneath each of the hole accumulating layers such that it extends beyond one side portion of the hole accumulating layer at its one side portion;
    a plurality of buried channel regions of the first conductivity type each formed on the well such that it is in contact with each of the photodetectors;
    a plurality of surface channel regions of the second conductivity type each formed over each of the buried channel regions, such that it does not extend up to the one side portion of the buried channel region at its one side portion;
    a plurality of channel stop regions of the second conductivity type each formed between the other side portions of each surface channel region and each buried channel region and the other side portions of each hole accumulating layer and each photodetector;
    a first electrode insulating film formed over the resulting entire exposed surfaces of the buried channel regions, the surface channel regions, the channel stop regions, the photodetectors and the hole accumulating layers;
    a plurality of charge injection electrodes each formed on the first electrode insulating film at one side portion of each buried channel region extending beyond one side portion of each corresponding surface channel region;
    a plurality of first transfer electrodes each formed on the first electrode insulating film above each surface channel region;

a plurality of second transfer electrodes each formed on each first polysilicon transfer electrode;

a plurality of second electrode insulating films formed around the first and second polysilicon transfer electrodes and adapted to isolate the electrodes from one another and from external;

a plurality of photo shield layers each formed over each of the second electrode insulating films; and a smoothing layer formed over the resulting entire exposed surfaces of the first electrode insulating film and the photo shield layers.

4. A solid state image sensor in accordance with claim 3, wherein the photodetectors are of the same kind.

5. A solid state image sensor in accordance with claim 3, wherein the second conductivity type well has shallow portions disposed beneath the first conductivity type photodetectors while having a larger depth at its other portions, so as to restrain an over flow drain.

6. A solid state image sensor in accordance with claim 3, wherein the second conductivity type hole accumulating layers and channel stop regions have an impurity concentration higher than that of the well.

7. A solid state image sensor in accordance with claim 3, wherein the charge injection electrodes and the first and second transfer electrodes are comprised of a polysilicon.

8. A solid state image sensor comprising:

a semiconductor substrate of a first conductivity type;

a well of a second conductivity type formed over the semiconductor substrate;

a plurality of uniformly spaced surface channel regions of the second conductivity type formed in the surface of the well;

a plurality of buried channel regions of the first conductivity type each formed beneath each of the surface channel regions such that it is in contact with the surface channel region;

a plurality of channel stop regions of the second conductivity type formed between neighboring channel regions each including each surface channel region and each buried channel region;

an electrode insulating film formed over the resulting entire exposed surfaces of the channel stop regions, the buried channel regions and the surface channel regions;

a transfer electrode formed over the electrode insulating film; and a smoothing layer formed over the transfer electrode.

9. A solid state image sensor in accordance with claim 8, wherein each surface channel region and each buried channel region have controlled depths, respectively, so that signal charge is independently generated in the surface channel region by incident light with short wavelength, whereas signal charge is independently generated in the buried channel region by incident light with long wavelength.

10. A solid state image sensor in accordance with claim 8, wherein the second conductivity type well has shallow portions disposed beneath the buried channel regions while having a larger depth at its other portions, so as to restrain an over flow drain.

11. A solid state image sensor comprising:

a semiconductor substrate of a first conductivity type;

a plurality of uniformly spaced channel stop regions of the first conductivity type formed on the semiconductor substrate;

a plurality of surface channel regions of the first conductivity type each formed in the central portion of each surface portion of the semiconductor substrate disposed between neighboring channel stop regions;

a plurality of first buried channel regions of a second conductivity type each formed beneath each of the surface channel region such that it is in contact with the surface channel region;

a plurality of first photodetectors each formed on the semiconductor substrate such that it is spaced a predetermined distance apart from one side portions of each corresponding surface channel region and each corresponding first buried channel region and in contact with each adjacent channel stop region;

a plurality of second photodetectors each formed on the semi conductor substrate such that it is spaced a predetermined distance apart from the other side portions of each corresponding surface channel region and each corresponding first buried channel region and in contact with each adjacent channel stop region;

a plurality of second buried channel regions each formed in each surface portion of the semiconductor substrate disposed between each second photodetector and the other side portions of each surface channel region and each first buried channel region;

a first electrode insulating film formed over the resulting entire exposed surfaces of the channel stop regions, the surface channel regions, the semiconductor substrate, the second buried channel regions, the first photodetectors and the second photodetectors;

a plurality of surface channel region electrodes each formed on the first electrode insulating film between each first photodetector and each corresponding surface channel region and adapted to transfer signal charge from the first photodetector to the surface channel region;

a plurality of buried channel region electrodes each formed on each surface portion of the first electrode insulating film disposed over each second buried channel region and adapted to transfer signal charge from each corresponding second photodetector to each corresponding buried channel region, via the second buried channel region;

a plurality of transfer electrodes each formed on each surface portion of the first electrode insulating film disposed over each surface channel region;

a plurality of second electrode insulating films formed around the transfer electrodes, the surface channel region electrodes and the buried channel region electrodes and adapted to isolate them from external;

a horizontal charge transfer region adapted to sequentially output signal charge from the surface channel regions and the first buried channel regions, in the charge input order; and a sensing amplifier adapted to sense signal charge from the horizontal charge transfer region.

12. A solid state image sensor in accordance with claim 11, wherein each of the first photodetectors is a pn-junction diode for receiving light of a visible range and each of the second photodetectors is a Schottky barrier diode for receiving light of an infrared ray range.

13. A solid state image sensor in accordance with claim 12, wherein each Schottky barrier diode is comprised of PtSi.

14. A solid state image sensor in accordance with claim 11, wherein the photodetectors are multiple kinds of regularly arranged photodetectors, without a limitation to two kinds.

* * * * *